United States Patent [19]

Walsh

[11] 4,380,074
[45] Apr. 12, 1983

[54] INTEGRATED CIRCUIT LASER AND ELECTRO-OPTICAL AMPLIFIER

[76] Inventor: Peter J. Walsh, 40 St. Joseph Dr., Stirling, N.J. 07980

[21] Appl. No.: 80,526

[22] Filed: Oct. 1, 1979

[51] Int. Cl.³ .............................................. H01S 3/19
[52] U.S. Cl. ...................................... 372/43; 330/4.3; 357/2; 357/17
[58] Field of Search ...................... 331/94.5 H, 94.5 E; 357/2, 17, 59, 61, 11, 30 R, 30 K; 372/43, 44, 50

[56] References Cited

U.S. PATENT DOCUMENTS 4,181,913 1/1980 Thornburg ............................. 357/2

Primary Examiner—James W. Davie
Attorney, Agent, or Firm—Darby & Darby

[57] ABSTRACT

In accordance with the present invention, a laser device is formed on an integrated circuit substrate, such as a silicon chip by sandwiching a thin-film amorphous semiconductor between reflective electrodes. The upper electrode is made only partially reflective so that, when an operating potential is applied between the electrodes, a stimulated emission of light energy in the infrared range is observed and this emission occurs through the upper electrode. To form a light amplifier, the lower reflecting electrode is omitted, so that the amorphous semiconductor and the substrate form a heterojunction which has low infrared reflectivity. In operating the amplifier, a potential is applied between the upper electrode and the substrate to control amplification. Incident radiation passes through the upper electrode and into the amorphous semiconductor and substrate and, in the process, is amplified in accordance with the value of the applied potential. This permits the incident radiation to be modulated in accordance with the applied potential. In a preferred embodiment incorporating the invention, at least one laser and an amplifier are incorporated on the same substrate as electronic circuits handling information signals. The laser is a source of light radiation and the amplifier is controlled with a voltage signal from the electronics to modulate laser radiation. Radiation is coupled between the laser and the amplifier and also out of the amplifier by means of optical wave guides which are fabricated on the substrate. The modulated radiation in the wave guide from the amplifier can then be provided directly to a fiber optic "transmission line".

10 Claims, 5 Drawing Figures

INTEGRATED CIRCUIT LASER AND ELECTRO-OPTICAL AMPLIFIER

The present invention relates generally to lasers and electro-optical amplifiers and, more particularly, concerns devices of this type which are capable of being incorporated on existing integrated circuit chips and similar substrate materials.

Owing to the very wide transmission band which is available, telephone and other communication systems have begun utilizing fiber optic light guides to transmit information in the form of light energy. Such systems typically use coherent light sources, such as lasers, to provide the basic light energy carrier which is encoded with the information from electronic systems. To date, it has been necessary to handle the information separately in the form of electrical signals and then to apply it to the light sources. In addition, substantial losses are experienced in transmitting these light signals over great optical fiber lengths, so that there is also a need for a repeater or amplifier function to be performed at intervals along a fiber optic light guide. It is believed that more efficient, more compact, and less costly communication systems and various other types of systems would result if it were possible to incorporate lasers and optical amplifiers on the same integrated circuit chips as the electronics.

It is therefore the primary object of the present invention to incorporate lasers, incoherent light sources, and electro-optical amplifiers on an intergrated circuit chip. It is specifically intended that lasers, incoherent light sources and electro-optical amplifier devices be provided which are capable of being fabricated directly on the circuit chips used in integrated circuits.

It is another object of this invention to provide laser, incoherent light sources and electro-optical amplifier devices which may be fabricated on integrated circuit chips using standard techniques to integrated circuits.

It is another object of this invention to provide integral lasers, incoherent light sources and opto-electronic amplifiers which can operate equally well at room temperature and at all temperatures normally encountered on integrated circuit chips.

It is a further object of this invention to provide at least one coherent light source and at least one electrically controlled light amplifier together on an integrated circuit chip with electronic circuits used to process information signals.

In accordance with the present invention, a laser device or an incoherent light source is formed on an integrated circuit substrate, such as a silicon chip, by sandwiching a thin-film amorphous semiconductor between reflective electrodes. The upper electrode is made only partially reflective so that, when an operating potential is applied between the electrodes, a stimulated emission of light energy in the infrared range is observed and this emission passes through the upper electrode. To form a light amplifier, the lower reflecting electrode is omitted, so that the amorphous semiconductor and the substrate form a heterojunction which has low infrared reflectivity. An incoherent light radiator can be obtained by operating the amorphous semiconducting material below its characteristic threshold current above which the radiation is coherent. In operating the amplifier, a potential is applied between the upper electrode and the substrate to control amplification. Incident radiation passes through the upper electrode and into the amorphous semiconductor and substrate and, in the process, is amplified in accordance with the value of the applied potential. This permits the incident radiation to be modulated in accordance with the applied potential. An alternative embodiment places the amorphous material in a gap between narrow reflecting or transparent electrodes lying parallel to the chip surface, with the assembly insulated from the chip by a dielectric layer. Light is then emitted parallel to the chip surfaces.

In a preferred embodiment incorporating the invention, at least one laser and an amplifier are incorporated on the same substrate as electronic circuits handling information signals. The laser is a source of light radiation and the amplifier is controlled with a voltage signal from the electronics to modulate laser radiation. Radiation is coupled between the laser and the amplifier and also out of the amplifier by means of optical wave guides which are fabricated on the substrate. The modulated radiation in the wave guide from the amplifier can then be provided directly to a fiber optic "transmission line".

The foregoing brief description, as well as further objects, features, and advantages of the present invention will be understood more completely from the following detailed description of presently preferred, but nonetheless illustrative, embodiments in accordance with the present invention, with reference being had to the accompanying drawings wherein.

Figure 3:
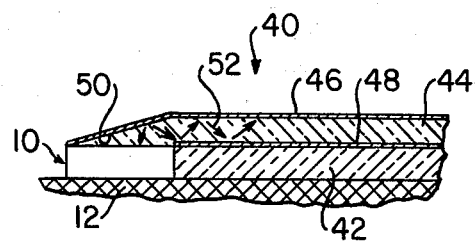
Figure 4:
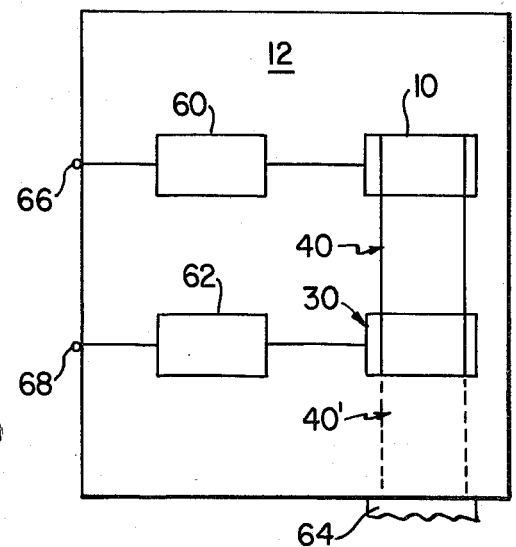

FIG. 3 is a sectional view of an integrated circuit chip incorporating a laser device in accordance with the present invention and showing one arrangement for guiding light from a laser along the intergrated circuit chip; and FIG. 4 is a top plan view of an integrated circuit chip for an electro-optical processor incorporating a laser, an optical amplifier, and various electronics on a single chip.

Figure 5:
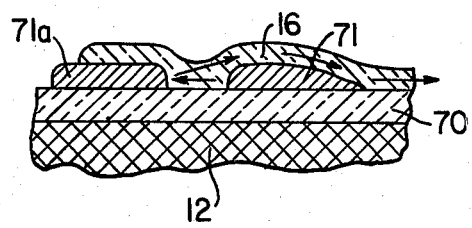

FIG. 5 is a sectional view showing a portion of an integrated circuit chip on which a gap laser device in accordance with the present invention has been fabricated.

Figure 1:
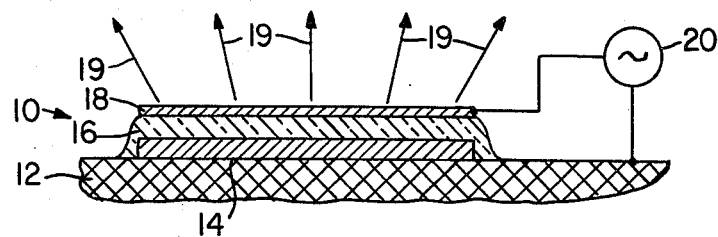
FIG. 1 is a sectional view showing a portion of an integrated circuit chip on which a laser device in accordance with the present invention has been fabricated.

Referring now to the details of the drawings, FIG. 1 illustrates a preferred construction for an integral laser device 10 in accordance with the present invention. The device 10 is shown fabricated on a silicon chip 12, which could also form the substrate for conventional electronic integrated circuits. On the substrate 12, an electrically conductive electrode 14 is formed on substrate 12 by conventional techniques. This electrode is preferably made of aluminum with a thickness of one tenth of a micron. However, various other conductive materials may be used with a thickness as little as 0.01 micron, so long as the electrode reflects infrared radiation. Over electrode 14, there is formed a thin film 16 of an amorphous semiconductor, such as $Te_{39} As_{36} Si_{17} Ge_7 I P_1$ or $As_{50}Te_{50}$. The film 16 is preferably about one micron thick, but it is believed that thicknesses in the range of about 0.7 microns to about three microns will also be effective. Over film 16, a second conductive electrode 18 is formed. Electrode 18 can be made of molybdenum with a thickness of about 0.01 micron, but other conductive materials and other thicknesses would also be effective, provided the resulting electrode partially reflects and partially transmits infrared radiation.

Laser operation of the device 10 is achieved by applying a voltage pulse between the electrodes 14 and 18, for example from a source 20 to initiate a conducting path in the amorphous material 16. The maintenance voltage applied between the electrodes may be less than one volt, but laser operation will not ensue unless sufficient current is provided to exceed a threshold current (typically in the range of 6-10 milliamperes) which is characteristic of the device 10. The radiation produced by the device 10 is in the infrared range and the specific wave length used is determined by the band gap width of the particular amorphous semiconductor used. It has been found that the energy of the output is approximately half the band gap energy for the amorphous semiconductor. It is, however, possible to control the band gap width of the film 16 by using a suitable amorphous semiconductor and by conventional doping techniques, so that a relatively wide range of infrared lasers should be obtainable. With respect to the presently preferred materials $Te_{39} As_{36} Si_{17} Ge_7 P_1$ Ge7 and P1 produces radiation with a wave length of approximately 2.1 microns and $As_{50} Te_{50}$ produces radiation with a wave length of about 2.5 microns. In FIG. 1, the radiation is represented by the referenced character 19 and is shown travelling upward after passage through the electrode 18, which is partially transparent to infrared radiation.

Figure 2:
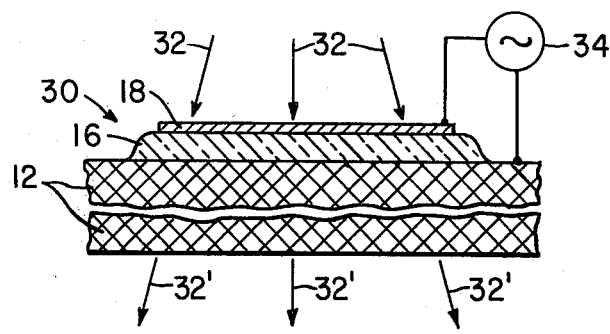
FIG. 2 is a sectional view of a portion of an integrated circuit chip on which an amplifier device in accordance with the present invention has been fabricated.

FIG. 2 illustrates the construction of an electro-optical amplifier 30, which directly amplifies incident radiation 32 to provide the radiation 32' under control of an electrical signal from a source 34. The construction of the amplifier 30 is substantially identical to the construction of laser 10, except that the reflective electrode 14 is absent. In FIG. 2, elements corresponding to respective elements in FIG. 1 are indicated with the same reference characters. In operation, the incident light 32 passes through electrode 18 and into amorphous semiconductor film 16 and is amplified through the action of the signal applied by source 34. Silicon substrate 12 is electrically conducting but is transparent to infrared radiation, so that the amplified radiation passes therethrough and exits from the opposite side thereof.

Referring now to FIG. 3, there is illustrated an arrangement for guiding emitted light from a device along the integrated circuit chip. For illustrative purposes, the laser device 10 has been selected. It will be appreciated that, for an amplifier device 30, the same arrangement could be provided on the opposite circuits of the substrate 12. The light guide 40 is fabricated on the surface of the chip over the laser device 10 by conventional techniques. Light guide 40 is supported, for example, on a layer of silicon dioxide 42. The illustrated wave guide is comprised of an infrared radiation transmitting medium 44, such as silicon dioxide, which is sandwiched between reflective coatings 46 and 48 of, for example, silver. The inclined surface 50 is provided within the guide 40 so that radiation emitted from laser 10 is reflected down the guide 40, through a sequence of consecutive reflections, as indicated by the arrows 52. The coating 46 may not be necessary if the material 44 interfaces with air or can be coated with a material having a lower index of refraction. Under such circumstances the inclination of surface 50 with respect to the upper surface of the laser would be selected so that radiation emitted from the laser would impinge on surface 50 at an angle beyond the critical angle and would be reflected therefrom. In the gap embodiment of the laser mentioned above and shown in FIG. 5, the light guide can be fabricated directly adjacent to the amorphous material and parallel to the chip surface so that the guided laser light need not pass through the reflecting electrodes but will enter the guide due to optical diffraction or reflection.

In FIG. 4, all of the structural elements described thus far are combined to show, in simplified form, an integrated circuit chip incorporating electronics 60 and 62, a laser device 10, an amplifier device 30, and a light guide 40 connecting the laser 10 and amplifier 30. In addition, a second light guide 40', similar to light guide 40, is provided on the undersurface of the substrate 12 and couples the radiation emitted by amplifier 12 to a conventional fiber optic 64. The electronics 60 could include, for example, timing and switching elements, including a device to provide the drive pulses to the laser 10. Electronics 60 receives power and various other signals from outside the chip by means of conventional terminals represented in FIG. 4 by a single terminal 66. Electronics 62 incorporates information elements, such as voice and channel selectors, and external signals applied to electronics 62 by means of conventional terminals represented by the terminal 68 in FIG. 4. Preferably, the entire chip is overcoated with silicon, beryllium oxide, or silicon dioxide, which provides a transparent, protective coating that also acts as a heat sink. It has been found that the devices 10 and 30 operate substantially independently of temperature and are essentially unaffected by temperature variations in the range normally encountered with integrated circuits.

FIG. 5 illustrates a gap embodiment in which the amorphous semiconducting material 16 lies between reflective conducting electrodes 71 and 71a, both separated from the substrate 12 by a dielectric layer 70. As shown the amorphous layer overlaps one contact to form a light path across the chip which may continue through the amorphous material or another light conducting material.

Although preferred embodiments of the invention have been disclosed for illustrative purposes, it will be appreciated by those skilled in the art that many additions, modifications, and substitutions are possible without departing from the scope and spirit of the invention as defined in the accompanying claims.

What is claimed is:

1. An opto-electronic device capable of being integrated on a substrate capable of having electronic integrated circuits fabricated thereon, said device being particularly suited for use as a source of laser energy radiation, comprising:

a first electrically conductive sheet;

a film of amorphous semiconductor material mounted in contact with said first electrically conductive sheet intermediate said sheet and said substrate, said first electrically conductive sheet and said substrate including means for applying an electrical signal therebetween;

a second electrically conductive sheet mounted on said substrate so that said film of amorphous semiconductor material is sandwiched between said first and second conductive sheets; and one of said electrically conductive sheets being made of a material which partially reflects and is partially transparent to laser radiation, the other electrically conductive sheet being made of a material which substantially entirely reflects laser radiation, said radiation being emitted from said device through said one conductive sheet upon the application of an electrical signal between said conductive sheets.

2. In combination with a device in accordance with claim 1, electronic integrated circuit means fabricated on said substrate and providing, at least, a signal coupled to said laser for causing the same to produce said emitted radiation.

3. A device in accordance with claim 1 wherein said first conductive sheet is made of aluminum and is in the range of 0.01 to 1 microns thick, said second conductive sheet is made of molybdenum and is approximately 0.01 microns thick, and said amorphous semiconductor film is made of one of $Te_{39}As_{36}Si_{17}Ge_7P_1$ and $As_{50}Te_{50}$ and is approximately in the range of 0.7 to 3 microns thick, and said substrate is made of silicon, said laser being actuated to produce said emitted radiation by having an electrical signal applied between said first and second conductive sheets which causes an electric current in excess of five milliamperes to flow within said laser device.

4. An opto-electronic device capable of being integrated on a substrate capable of having electronic integrated circuits fabricated thereon, said device comprising:
   a first electrically conductive sheet made of a material which at least partially reflects radiant light mounted in opposed relationship with respect to said substrate;
   a film of amorphous semiconductor material mounted in contact with said first electrically conductive sheet intermediate said sheet and said substrate, said first electrically conductive sheet having means for applying an electrical signal thereto; and
   means for transmitting radiant light energy between said film and the exterior of said opto-electronic device.

5. A device in accordance with claim 4 particularly suited for use as an opto-electronic amplifier responsive to an applied electrical signal to amplify directly light radiation incident thereon, said amplifier further comprising:
   said film of amorphous semiconductor material being mounted on said substrate; and
   said first electrically conductive sheet being made of a material which partially reflects and is partially transparent to light radiation to be amplified, said conductive sheet being mounted so that said amorphous semiconductor film is sandwiched between said substrate and said conductive sheet, said incident radiation falling on and being transmitted through one of said substrate and said conductive sheet, said amplified radiation being emitted from said amplifier by transmission through the other of said substrate and said conductive sheet, said conductive sheet and substrate cooperatively defining said means for transmitting.

6. In combination with a device in accordance with claim 4, electronic integrated circuit means mounted on said substrate and providing, at least, an electrical signal applied to said amplifier for controlling the amplification thereof.

7. A device in accordance with any preceding claim wherein said amorphous semiconductor material is one of $Te_{39}As_6Si_{17}Ge_7P_1$ and $As_{50}Te_{50}$, said amorphous semiconductor film being approximately one micron thick.

8. A device in accordance with claim 1 or 4 wherein said first conductive sheet is made of alumimum and is approximately one tenth micron thick and said second conductive sheet is made of molybdenum and is approximately 0.01 micron thick.

9. In combination with a device in accordance with claims 1 or 4, a guide for light emitted by said device, said guide comprising:
   a main body made of a material which is transparent to said emitted radiation;
   a first surface on said main body having a portion which is transparent to said emitted radiation, the remainder of said surface being reflective of said radiation;
   a second surface on said body which is reflective of said emitted radiation, a portion of said second surface in the vicinity of said portion of said first surface being inclined with respect to said first surface, the remainder of said second surface being substantially parallel to said first surface; and
   said guide being mounted with respect to said device so that transparent portion of said first surface has said emitted radiation incident thereon.

10. A device in accordance with claim 4 particularly suited for the generation and emission of light radiation, said device further comprising:
   a second electrically conductive sheet made of a material which at least partially reflects said radiation mounted in opposed relationship with respect to said substrate, said electrically conductive sheets being positioned to reflect said radiation from one to the other; and
   said film of amorphous semiconductor material being sandwiched between said first and second electronically conductive sheets to produce light radiation upon the application of an electrical potential between said sheets, at least one of said sheets being mounted on said substrate such that non-reflected light radiation is optically conducted away from the area between said contacts, thus defining said means for transmitting.

* * * * *